United States Patent
Hsu

(10) Patent No.: US 9,658,633 B2
(45) Date of Patent: May 23, 2017

(54) POWER MONITORING SYSTEM AND A REDUCED IMPEDANCE METHOD FOR THE POWER MONITORING SYSTEM

(71) Applicant: ELIFECONNECTION CO., LTD., Taipei (TW)

(72) Inventor: Cheng-Tsuen Hsu, Taipei (TW)

(73) Assignee: ELIFECONNECTION CO., LTD., Taipei (TW)

( * ) Notice: Subject to any disclaimer, the term of this patent is extended or adjusted under 35 U.S.C. 154(b) by 425 days.

(21) Appl. No.: 13/999,853

(22) Filed: Mar. 28, 2014

(65) Prior Publication Data

US 2015/0045980 A1 Feb. 12, 2015

(30) Foreign Application Priority Data

Aug. 6, 2013 (TW) .............................. 102128183 A

(51) Int. Cl.
| | |
|---|---|
| *G05F 1/00* | (2006.01) |
| *G05F 1/66* | (2006.01) |
| *H05K 3/10* | (2006.01) |
| *H05K 1/02* | (2006.01) |

(52) U.S. Cl.
CPC .............. *G05F 1/66* (2013.01); *H05K 3/10* (2013.01); *H05K 1/0263* (2013.01); *H05K 2201/10287* (2013.01); *Y10T 29/49155* (2015.01)

(58) Field of Classification Search
None
See application file for complete search history.

(56) References Cited

U.S. PATENT DOCUMENTS

| | | | | |
|---|---|---|---|---|
| 5,578,980 A | * | 11/1996 | Okubo ................... | H01H 9/542 335/132 |
| 5,699,218 A | * | 12/1997 | Kadah .................... | H01H 9/542 361/13 |
| 5,790,354 A | * | 8/1998 | Altiti ...................... | H01H 9/542 361/13 |
| 5,818,710 A | * | 10/1998 | LeVan Suu ............ | H01H 9/542 340/656 |
| 6,018,690 A | * | 1/2000 | Saito ........................ | H02J 3/14 700/293 |
| 6,347,024 B1 | * | 2/2002 | Blain ...................... | H01H 9/542 361/13 |
| 6,621,668 B1 | * | 9/2003 | Sare ........................ | H01H 9/542 361/13 |
| 6,624,532 B1 | * | 9/2003 | Davidow .................. | H02J 3/14 307/31 |

(Continued)

*Primary Examiner* — Christopher E Everett
(74) *Attorney, Agent, or Firm* — Jianq Chyun IP Office

(57) ABSTRACT

A power monitoring system comprises an input module, a plurality of switches, a plurality of power supply ports, a detecting module, a control module, and a wireless transmission module. The each switch was set in between the input module, and each switch has an address. The detecting module generates a power loading value by set in between the input module and each power supply port. The control module connects to switches, the detecting module and the wireless transmission module, thus, the control module can read the power loading values from the detecting module, and control each switch which corresponds to the address by a preset rule or a command from the wireless transmission module. It will not only save energy but also improve the electricity security for the household.

9 Claims, 6 Drawing Sheets

(56) References Cited

U.S. PATENT DOCUMENTS

| | | | | | |
|---|---|---|---|---|---|
| 7,274,183 | B1* | 9/2007 | Gu | ............... | H02M 3/156 323/288 |
| 8,053,933 | B2* | 11/2011 | Smith | ............... | H01H 9/542 307/112 |
| 8,890,505 | B2* | 11/2014 | Forbes, Jr. | ............... | G06Q 10/00 323/299 |
| 9,076,607 | B2* | 7/2015 | Premerlani | ............... | H01H 1/0036 |
| 2002/0171983 | A1* | 11/2002 | Brooks, Jr. | ............... | H01H 9/542 361/2 |
| 2003/0198002 | A1* | 10/2003 | Vail | ............... | H01H 9/547 361/160 |
| 2004/0066587 | A1* | 4/2004 | Schasfoort | ............... | H01H 9/542 361/8 |
| 2004/0113713 | A1* | 6/2004 | Zipper | ............... | H01H 1/0036 333/103 |
| 2008/0048807 | A1* | 2/2008 | Yao | ............... | H01H 9/542 335/99 |
| 2008/0137238 | A1* | 6/2008 | Wright | ............... | H01H 9/541 361/2 |
| 2008/0250171 | A1* | 10/2008 | Pfingsten | ............... | H01H 9/542 710/61 |
| 2009/0236909 | A1* | 9/2009 | Aldag | ............... | H01R 25/142 307/39 |
| 2009/0265042 | A1* | 10/2009 | Mollenkopf | ............... | H02J 3/12 700/298 |
| 2010/0134931 | A1* | 6/2010 | Orozco | ............... | H01H 9/542 361/3 |
| 2010/0328849 | A1* | 12/2010 | Ewing | ............... | G06F 1/266 361/622 |
| 2011/0102052 | A1* | 5/2011 | Billingsley | ............... | H01H 9/542 327/365 |
| 2011/0264299 | A1* | 10/2011 | Mazzoli | ............... | H02J 3/01 700/298 |
| 2012/0016613 | A1* | 1/2012 | Yang | ............... | G01R 27/16 702/65 |
| 2012/0026640 | A1* | 2/2012 | Doellerer | ............... | H01H 9/542 361/190 |
| 2012/0092060 | A1* | 4/2012 | Ganesan | ............... | H03K 17/0824 327/419 |
| 2013/0229068 | A1* | 9/2013 | Sanders, III | ............... | H01H 47/002 307/115 |
| 2013/0338844 | A1* | 12/2013 | Chan | ............... | H01R 13/6683 700/295 |

* cited by examiner

POWER MONITORING SYSTEM AND A REDUCED IMPEDANCE METHOD FOR THE POWER MONITORING SYSTEM

FIELD OF THE INVENTION

The present invention relates to a multi-ports power monitoring system and a method for reducing the resistance thereof, and more particularly to a multi-ports power monitoring system has remote monitoring and save power consumption and a method for reducing the resistance to increase the amount of the current.

BACKGROUND

The modern science and technology is developed rapidly and more and more diverse applications for electronic devices. However, the home power socket is limited such that the power extension cord will become increasingly important.

In order to improve the using security of electricity supply extension cord, how to remote monitor the power extension cord has become a trend, and interne access device is installed on each power extension cord for some electronic products to remote monitor the power extension cord so indeed bring the great practical for the application of power extension cord.

However, for current technology, no matter the remote control power extension cord is powered or not, most of them merely to be fully turn on or fully turn off. User cannot control or monitor each individual power sockets. In addition, the switch of general power extension cord is a traditional relay, such as electromechanical relay (EMR). Although EMR is capable of carrying greater currents, but the power consumption of EMR is relatively higher, even the electronic product is in its standby, the higher power is consumed continuously. For the household or general office, the frequency for using the electronic product with high-current demand is not high, such that a lot of energy loss and waste will be generated, and there are many users may not even know that the part of electricity bill is from the power extension cords, and the user even is no way to avoid this waste of energy.

Thus, for a multi-port power monitoring system, a relay with relatively lower power consumption is used as a switch while the current loading capacity of the original power extension cord should be maintained to remote monitor the system of each power sockets, such that the energy can be saved and the electrical security effectiveness can also be improved.

SOME EXEMPLARY EMBODIMENTS

It is one object of this invention is to provide a multi-ports power monitoring system and a method for reducing resistance thereof, and more particularly to a multi-ports power monitoring system and a method for reducing the resistance that is capable of energy-saving effect.

In one embodiment, the present invention provides a multi-ports power monitoring system which includes a plurality of power supply ports, an input module, a plurality of switches and a control module. The input module is provided for receiving a voltage. Each the plurality of switches is electrically connected the input module with each the plurality of power supply ports for controlling the voltage to conduct the corresponded power supply port, in which each the plurality of switches has an address. The control module is electrically connected in the middle of each the plurality of switches for controlling each the plurality of switches.

In another embodiment, the present invention provides a multi-ports power monitoring system further includes a detecting module. The detecting module is electrically connected the input module with each the plurality of power supply ports for measuring the power loading value of each the plurality of power supply ports.

In addition, the control module controls each the plurality of switches by a preset rule. The preset rule includes the power loading value is accessed by detecting module and the address of the switch module corresponded power loading value is received. The power loading value is compared with the preset threshold value. When the power loading value is higher than the preset threshold value, the switch is switched to high power efficiency mode according to the address. When the power loading value is lower than the preset threshold value, the switch is switched to a low power consumption efficiency mode according to the address.

In another embodiment, the multi-ports power monitoring system of the present invention further includes a wireless transmission module. The wireless transmission module is electrically connected the control module and is communicated with the remote server by a wireless network, in which the remote server is communicated with the control module by the wireless transmission module and accesses the power loading value which is corresponding to each addresses from the control module and instructs the control module to control the corresponded each the plurality of switches of each addresses.

In another embodiment, each the plurality of switches of the multi-ports power monitoring system of the present invention includes a first switch and a second switch. The first switch is electrically connected the corresponded power supply port with the input module and is further electrically connected the control module. The second switch is electrically connected the corresponded power supply port with the input module and is further electrically connected with the control module. When the first switch is conducted and the second switch is not conducted, the switch is set in a low power consumption efficiency mode. When the first switch is not conducted and the second switch is conducted, the switch is set in a high power efficiency mode. When both the first switch and the second switch are not conducted, the switch is set in turn off mode.

In another embodiment, the multi-ports power monitoring system of the present invention further includes a first low resistor and a second low resistor. The first low resistor is electrically connected the input module with each the plurality of switches for reducing the resistance between the input module and each the plurality of switches and the heat is generated by large loading that is also to be reduced. The second low resistor is electrically connected the input module with each the plurality of power supply ports to reduce the resistance in the middle of the input module and each the plurality of power supply ports and the heat is generated by the large power loading that is also to be reduced.

The present invention further provides a method for reducing the resistance of the multi-ports power monitoring system which is applied for a multi-ports power monitoring system. The method for reducing the resistance of the multi-ports power monitoring system includes a circuit board that is provided and a circuit layout and a conducting line of the multi-ports power monitoring system are disposed respectively on one surface of the circuit board, in which the conducting line is used for transferring the voltage and a conductor is overlapped on the conducting line.

Therefore, to compare with the current multi-ports power monitoring system, the multi-ports power monitoring system of the present invention can detect the power consumption for each the plurality of power supply ports by detecting module and automatically control the conduct mode for each the plurality of switches by preset rule of the control module. Furthermore, user can remote monitor the electricity consumption of each the plurality of power supply ports according to the corresponded address. According to above discussion, it not only can save the energy consumption while the maximum amount of current situation can be maintained, but also the household electrical safety can be increased to achieve the convenient and practical effect.

BRIEF DESCRIPTION OF THE DRAWINGS

The above objects and advantages of the present invention will become more readily apparent to those ordinarily skilled in the art after reviewing the following detailed description and accompanying drawings, in which.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

Figure 1:
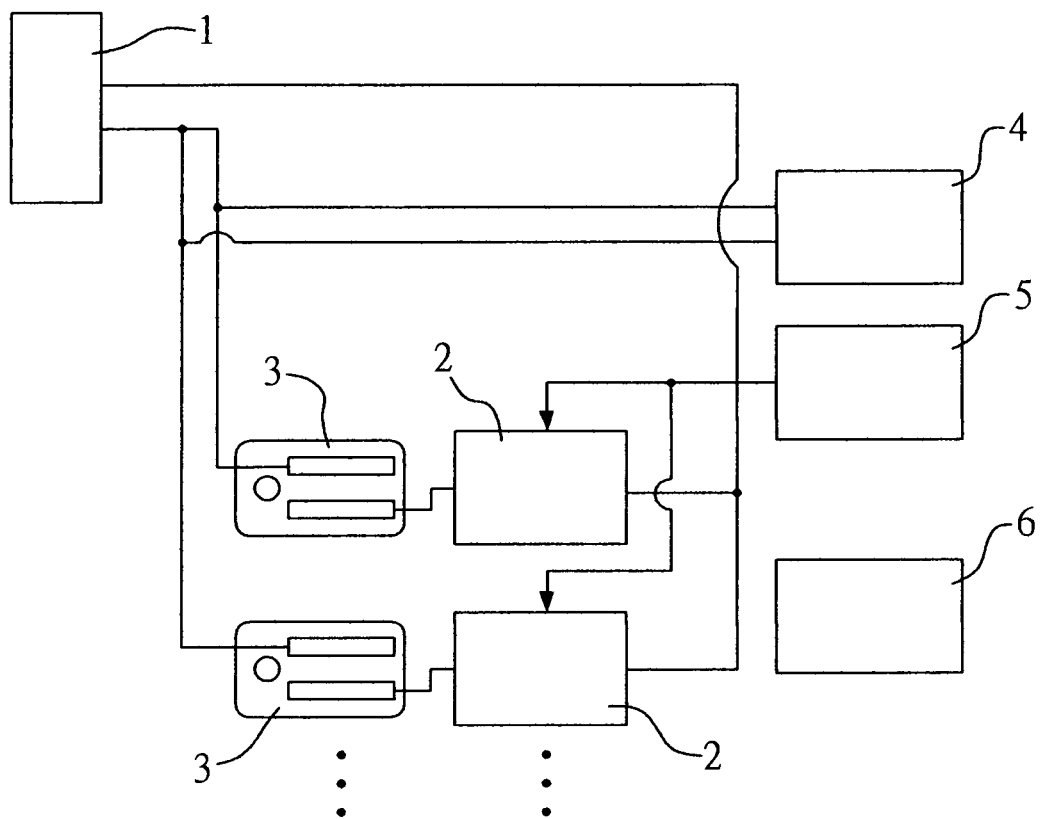
FIG. 1 is a schematic view of the module of a multi-ports power monitoring system of one embodiment in accordance with the present invention disclosed herein.
Figure 2:
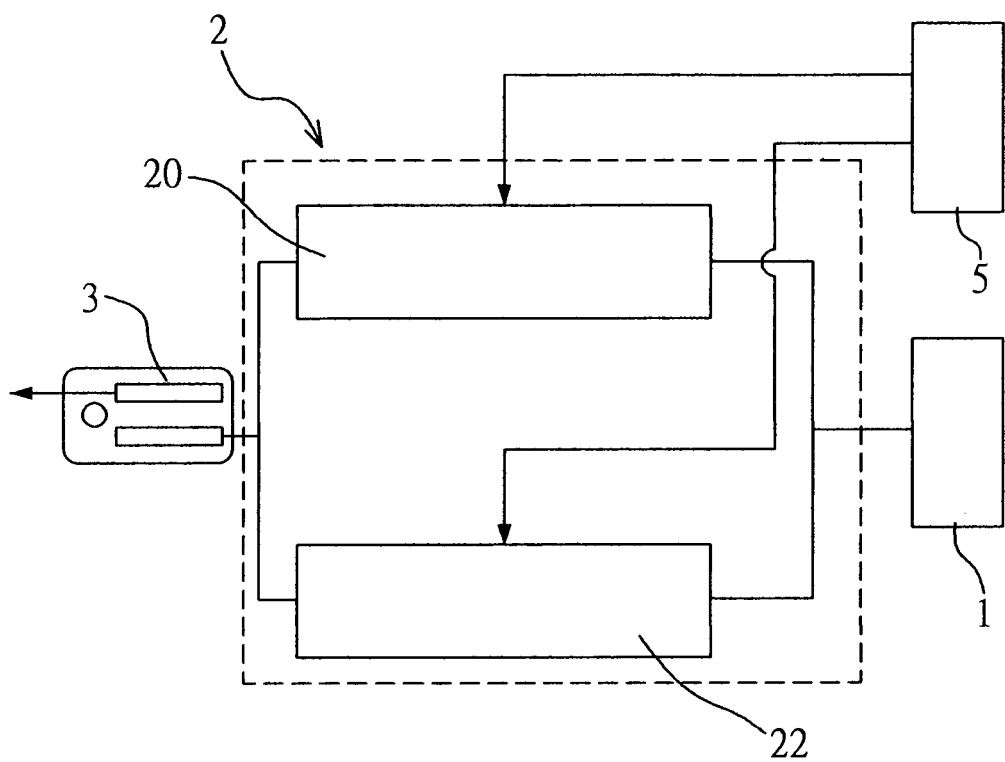
FIG. 2 is a schematic view of the switch of a multi-ports power monitoring system of one embodiment in accordance with the present invention disclosed herein.
Figure 3:
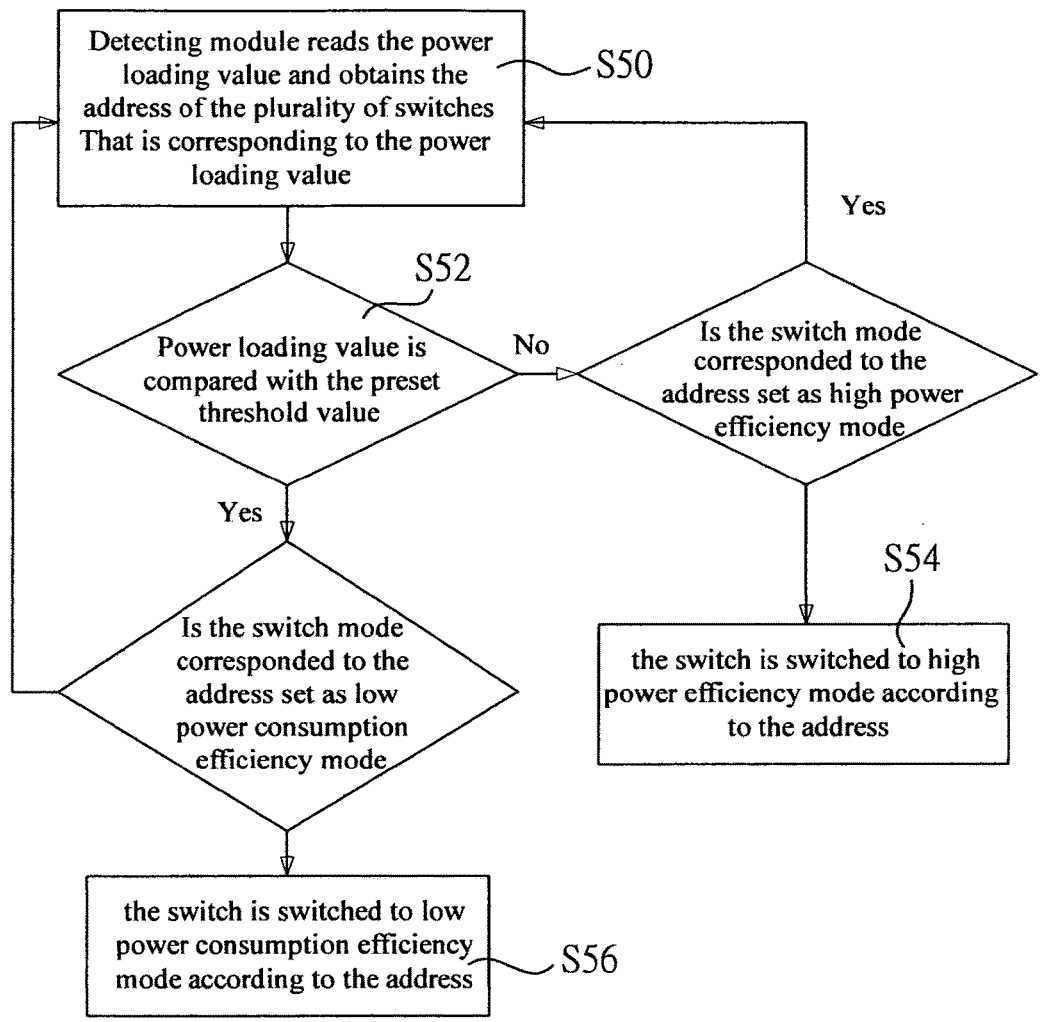
FIG. 3 is a flow chart of the preset rule of a multi-ports power monitoring system of one embodiment in accordance with the present invention disclosed herein.

Please refer to FIG. 1 to FIG. 3. FIG. 1 is a schematic view of the module of a multi-ports power monitoring system. FIG. 2 is a schematic view of the switch of the multi-ports monitoring system. FIG. 3 is a flow chart of the preset rule of a multi-ports power monitoring system. As shown in FIG. 1 to FIG. 3, the multi-ports power monitoring system of the present invention can apply for a power extension cord or a layout of a household power. The multi-ports power monitoring system receives a voltage from the power socket or an electrical box. The multi-ports power monitoring system also includes a plurality of power supply ports 3 that is provided for transferring the voltage to at least one electronic equipment. The multi-ports power monitoring system includes an input module 1, a plurality of switches 2, a detecting module 4, a control module 5 and a wireless transmission module 6.

The input module 1 can be a socket which is electrically connected with the power socket and receives the voltage from the power socket.

One end of the plurality of switches 2 is electrically connected with the input module 1 for receiving the voltage from the input module 1. Each the plurality of switches 2 with a corresponding number or an address. That is, each the plurality of switches 2 has an address and each addresses represents different switch 2.

As shown in FIG. 2, in one embodiment, each the plurality of switches 2 includes a first switch 20 and a second switch 22, and one end of the first switch 20 and one end of the second switch 22 are parallel in the input module 1, in which the first switch 20 is a solid state relay (SSR) which has low power consumption ability when the multi-ports power monitoring system is driven such that the power consumption can be reduced efficiency. The second switch 22 is a traditional electromechanical relay (EMR) which has relatively smaller effect on temperature change.

Although the solid state relay has low power consumption properties, but the temperature changed is very sensitive which is generated by the large current loading, such that the first switch 20 cannot withstand high power output steady. Thus, by the second switch 20 is a traditional relay, the second switch 20 can maintain the multi-ports power monitoring system has the largest current to conduct each the first switch 20 and each the second switch 22 of each the plurality of switches 2 by switching, such that the loading can be operated in a high power efficiency mode, a low power consumption efficiency mode and a turn off mode to achieve the high efficiency and energy-saving effect.

In one embodiment, the definition of low power consumption is that the first switch 20 is conducted and the second switch 22 is not conducted. When the second switch 22 is conducted and the first switch 20 is not conducted, it can be defined as the high power efficiency mode. When both the first switch 20 and the second switch 22 are not conducted, it can be defined as the turn off mode.

Each the plurality of power supply ports 3 is electrically connected with corresponded each the plurality of switches 2, that is, each the plurality of power supply ports 3 is electrically connected with another end of the first switch 20 and the second switch 22 of each the plurality of switches 2 opposite to the input module 1. Another end of each the plurality of power supply ports 3 is electrically connected with another end of the input module 1 opposite another end of each the plurality of switches 2. Each the plurality of power supply ports 3 is parallel to each other by each the plurality of switches 2 corresponded to the address and is further electrically connected to electronic equipment with a socket for outputting the voltage to the electronic equipment to provide the required electricity power for the electronic equipment.

The detecting module 4 includes a multi-unit. The detecting module 4 utilizes the multi-unit to electrically connect each the plurality of power supply ports 3 with the input module 1 and to switch between each the plurality of power supply ports 3 by address according to a preset detecting frequency for measuring the power consumption of each corresponded the plurality of power supply ports 3 by detecting module 4. The detecting module 4 will generate a power loading value corresponded to the measuring result. Thus, the power consumption of the plurality of power supply ports 3 can be measured respectively by using one detecting module 4 to reduce the cost, in which the power loading includes a voltage value, a current value, and a power loading value.

The control module 5 includes a detecting pin, a plurality of control pins and a wireless network pin and instructs the power output for each the plurality of switches 2 according to a preset rule, in which the detecting pin is electrically connected with the detecting module 4 for reading each the power loading value from the detecting module 4 and calculating the total power loading value of each power loading value (such as the accumulation value of power consumption) in a preset time segment to obtain the power consumption of each the plurality of power supply ports 3 of each corresponded address in preset time segment and even calculating average power loading value of each the plurality of power supply ports 3 of each corresponded address. Each the control pins is electrically connected with the first switch 20 and the second switch 22 of the plurality of switches 2 corresponded to each address, and instructs the conducting of the first switch 20 and the second switch 22 to control the power output of each the plurality of switches 2 that is corresponding to each addresses. That is, the switch between the high power efficiency mode, low power consumption efficiency mode and turn off mode of each the plurality of switches 2 is controlled by each the addresses.

As shown in FIG. 3, the preset rule includes the detecting module 4 that reads the power loading value and obtains the address of the plurality of switches 2 that is corresponded to the power loading value in step S50. Then, the power loading value is compared with the preset threshold value in step S52. When the power loading value is higher than preset threshold value and the switch mode is set as low power consumption efficiency mode, the switch 2 is switched to high power efficiency mode according to the address in step S54. Otherwise, when the power loading value is set as lower than the preset threshold value and the switch 2 is set as high power efficiency mode, the switch 2 is switched to low power consumption efficiency mode according to the address is in Step 56, in which the preset threshold value can be set according to the environment or use habit. The preset threshold of the present invention is 50 Watt (W).

For example, if the power consumption of a desktop personal computer in standby state is about 3 W, the power consumption for booting the PC is about 70 W, and the power consumption after the completion of the booting the PC is about 40 W, and the user inserts the socket of the desktop PC in one of the plurality of power supply ports 3 of the multi-ports power monitoring system of the present invention. When the desktop PC is in standby state, the switch 2 is corresponding to the address of the power supply ports 3 that is supposed to be low power consumption efficiency mode in the multi-ports power monitoring system of the present invention. When the desktop PC is booted, the required power consumption of the desktop PC is increased. At this time, the control module 5 reads the power loading value of the power supply ports 3 that is corresponded to the address through the detecting module 4 and ensures the power loading value that is higher than the preset threshold value. When the switch 2 is set as low power consumption efficiency mode, the control module 5 will conduct the second switch 22 of the switch 2 according to step S54 and the first switch 20 is to be broken such that switch 2 is corresponding to the address which is transformed from low power consumption efficiency mode to high power efficiency mode and the detecting module 4 detects the plurality of power supply ports 3 continuously according to the preset detecting frequency. The control module 5 also reads the power loading value from the detecting module 4 to prepare for the next conversion operation.

Then, after the desktop is booted, the power consumption of the desktop PC will reduced to about 40 W, that is, the power consumption is lower than the preset threshold value. The control module 5 will read the power loading value of the power supply port 3 that is corresponding to the address through the detecting module 4 and ensure the power loading value is lower than the preset threshold value and the switch 2 is to beset as high power efficiency mode, the control module 5 will conduct the first switch 20 of the switch 2 that is corresponding to the address and the second switch 22 is to be broken, such that the switch 2 is switched from high power efficiency mode to low power consumption efficiency mode and the detecting module 5 measures the power supply port 4 continuously according to the preset detecting frequency, and the control module 5 will read the power loading value from the detecting module 4 continuously to prepare the next conversion operation.

Finally, when the state of the desktop is returned to the standby states, the power consumption of the desktop is reduced to about 3 W, the control module 5 will read the power loading value of the power supply ports 3 that is corresponding to the address through the detecting module 4 and ensure the power loading value is lower than the preset threshold value and the switch 2 is set as the low power consumption efficiency mode, the control module 5 will maintain the switch 2 is set as the low power consumption efficiency mode without switching the mode and read the power loading value continuously from the detecting module 4.

Please refer to FIG. 1, the wireless transmission module 6 is in compliance with IEEE802.11 or IEEE 802.15.4 standard communication transmission module, which is electrically connected with the wireless network pin of the control module 5 and is communicated with the remote server by using wireless network (for example Wi-Fi or ZigBee). The control module 5 communicates the power output information of each address of each the plurality of power supply ports 3 to the remote server. The remote server is communicated with the control module 5 by wireless network through the wireless transmission module 6 and instructs the control module 5 to control the switch 2 that is corresponding to each address. The remote server can output a turn on signal and a turn off signal through the wireless transmission module 6 to the control module 5, in which the turn on signal and the turn off signal will correspond to an address respectively. The control module 5 will control the power output of the switch 2 of corresponded address according to turn on signal and turn off signal respectively.

Furthermore, when the control module 5 receives the turn on signal from the wireless transmission module 6, the switch module 2 is corresponding to the address that is to be conducted to turn on the corresponded electric equipment. When the control module 5 receives the turn off signal, the switch module 2 is corresponding to the address that is to be conducted to turn off the corresponded electric equipment. In addition, the electric output information includes the power loading value of each the plurality of power supply ports 3, total power loading value and average power loading value.

For example, a mobile device (not shown) has a network connection function which installed with a multi-ports power monitoring system software or a computer that is communicated with the remote server and read the electric power output information from the remote server. When the user is not at home, the user can obtain a power loading value, total power loading value and average power loading value from the mobile device, in which a power loading value, total power loading value and average power loading value is consumed by the power supply ports 3 that is corresponding to an address of one of the power extension cord or household socket. Thus, user can find out the power supply ports 3 that should not be consumed at that time, that is, the user may be forgotten to turn off the electric equipment and let the electric equipment is operated continuously. User can transmit a turn off signal from the mobile device through the remote server to the wireless transmission module 6 to allow that the control module 5 receives the turn off signal from the wireless transmission module 6, and the assigned address of the power supply ports 3 is to be turned, such that the power cannot supply for the power supply ports 3 of assigned address to achieve each the plurality of power supply ports 3 is monitored by the corresponded each address. It is not only energy-saving but also increase the home life security.

Figure 4:
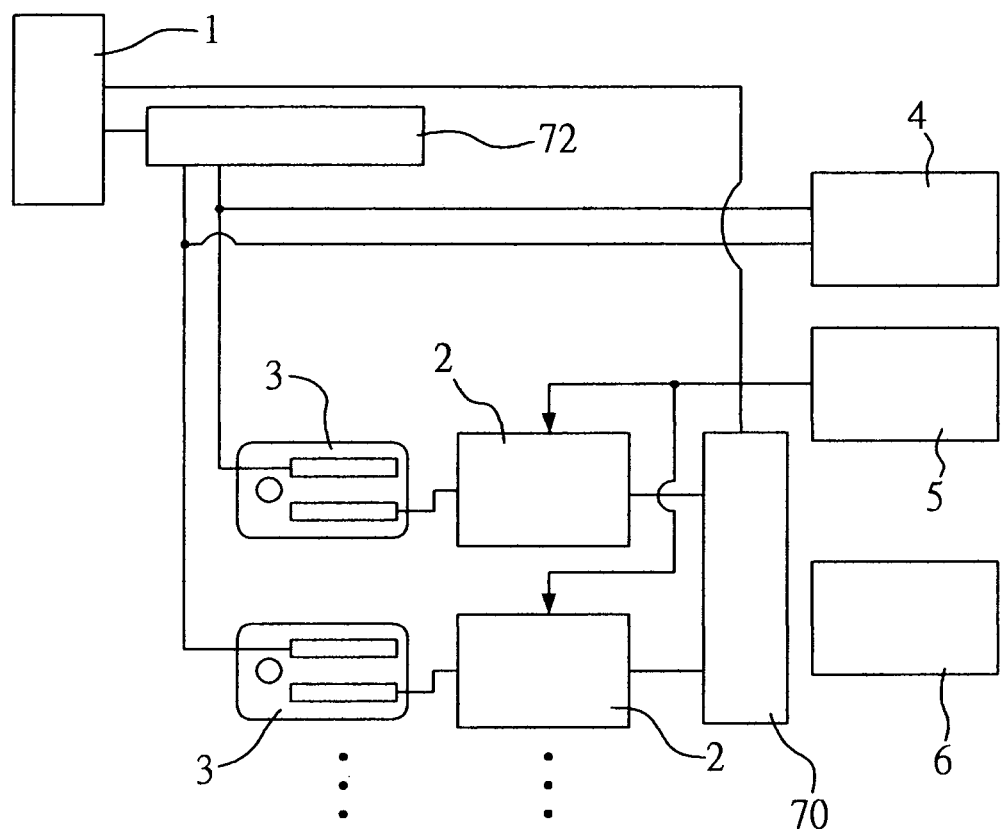
FIG. 4 is a schematic view of the module of a multi-ports power monitoring system of another embodiment in accordance with the present invention disclosed herein.
Figure 5:
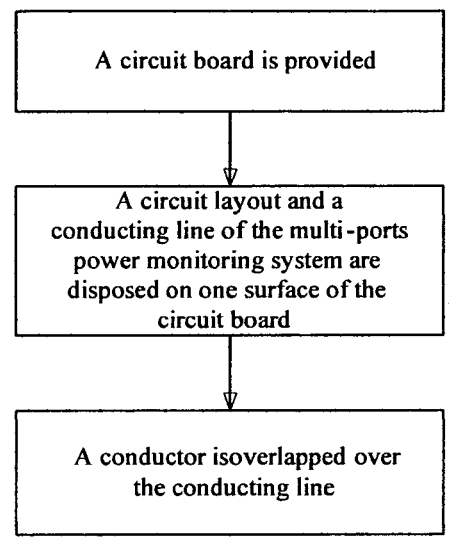
FIG. 5 is flow chart of the method for reducing the resistance of the multi-ports power monitoring system in accordance with the present invention disclosed herein.
Figure 6:
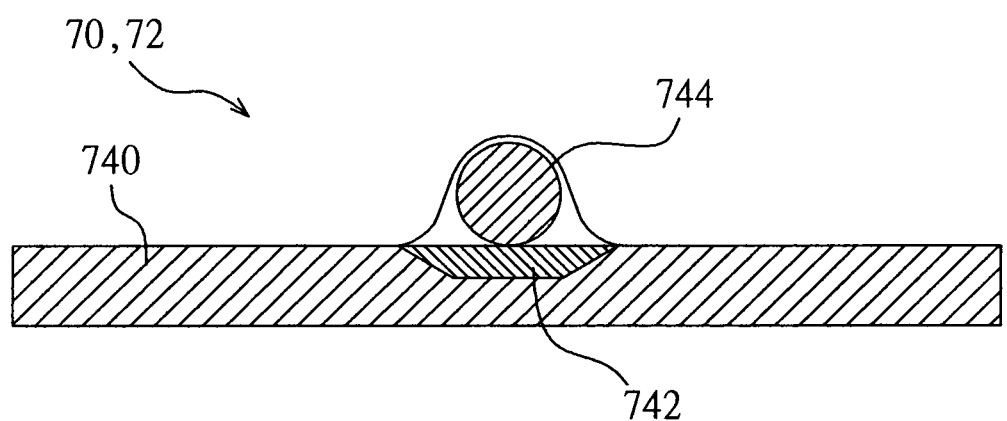
FIG. 6 is a schematic view of circuit layout of a multi-ports power monitoring system of another embodiment in accordance with the present invention disclosed herein.

Please refer to FIG. 4 to FIG. 6. FIG. 4 is a schematic view of a multi-ports power monitoring system of another embodiment of the present invention. FIG. 5 is a schematic view of a flow chart for the multi-ports power monitoring system of the present invention. FIG. 6 is a schematic of circuit layout for the multi-ports power monitoring system of the present invention.

In general, for the multi-ports power monitoring system with control functions, the switch components of the control system are disposed on a printed circuit board (PCB). The general printed circuit board is capable of carrying limited current. Therefore, a multi-ports power monitoring system can have a greater conduction path to provide more loading current.

As shown in FIG. 4, the multi-ports power monitoring system further includes a first low resistor 70 and a second low resistor 72. The first low resistor 70 is electrically connected the input module 1 with each the plurality of switches 2 and the current loading between the input module 1 and each the plurality of switches 2 is increased by way of reduction of the resistance of the multi-ports power monitoring system and the heat generation can also be reduced at the larger power loading. The second low resistor 72 is electrically connected the input module 1 with each the plurality of power supply ports 3 and current loading is increased between the input module 1 and each the plurality of power supply ports 3 by way of reduction of the multi-ports power monitoring system and the heat generation can also be reduced at the larger power loading. As shown in FIG. 6, the first low resistor 70 and the second low resistor 72 are disposed on the circuit board 740 respectively, and include a conducting line 743. The circuit board 740 is a printed circuit board. The conducting line 742 is a conducting wire between the input module 1 and each the plurality of switches 1 and between the input module 1 and plurality of power supply ports 3 and is used for transferring the voltage.

Please refer to FIG. 5. The method of reduction of the multi-ports power monitoring system is applied for the multi-ports power monitoring system, which includes a circuit board that is provided in step S760. A circuit layout and a conducting line of the multi-ports power monitoring system are disposed on one surface of the circuit board in step S762, in which the conducting line is used for transferring the voltage. A conductor is disposed on the conducting line in step S764. That is, the first low resistor 70 and the second low resistor 72 further includes a conductor 744 respectively, in which the conductor 744 is a copper wires which is electrically connected with the conducting line and is paralleled each other. The conductor 744 can be coated with conducting line 742 directly by solder (as shown in FIG. 6). Thus, the cross-sectional area of the conducting line 742 can be increased by the conductor 744, such that the conducting line 742 connected with the conductor 744 can have a greater conducting path and the resistance is to be reduced. Thereby the more current can pass through the multi-ports power supply monitoring system at the same time, and higher temperature is introduced by the damage and consumption which in generated by the current is passed through the conducting line 742.

Thus, to compare with the current multi-ports power monitoring system, the multi-ports power monitoring system of the present invention can detect the power consumption efficiency of each the plurality of power supply ports by detecting module and automatically control the conducting mode of each the plurality of switches by preset rule of the control module. The user can remote monitor the electricity consumption of each the plurality of power supply ports according to the corresponded address by the wireless transmission module. The power consumption is not only saving when the maximum amount of current can be maintained, but also the home electrical security effectiveness can be increased to achieve the convenient and practical efficiency.

Although specific embodiments have been illustrated and described, it will be obvious to those skilled in the art that various modifications may be made without departing from what is intended to be limited solely by the appended claims.

What is claimed is:

1. A power monitoring system including a plurality of power supply ports, and comprising:
   an input module being provided for receiving a voltage;
   a plurality of switches being electrically connected to the input module, and each switch having an address, wherein each of said plurality of power supply ports is configured for controlling the voltage conducted with the corresponding power supply ports, and each of said plurality of power supply ports comprises:
       a first switch being electrically connected between each corresponding of the plurality of power supply ports and the input module, wherein the first switch is a solid state relay; and
       a second switch being electrically connected between each corresponding of the plurality of power supply ports and the input module, wherein the second switch is an electromechanical relay; and
   a control module being electrically connected with the plurality of switches for controlling each of the plurality of switches according to a power consumption value that is corresponding to each the plurality of power supply ports,
   wherein when the power consumption value is lower than a preset threshold value, the control module conducts the first switch and does not conduct the second switch; when the power consumption value is higher than the preset threshold value, the control module conducts the second switch and does not conduct the first switch.

2. The power monitoring system according to claim 1, further comprising:
   a detecting module being electrically connected to the input module and the power supply ports for measuring the power consumption value that is corresponding to each the plurality of power supply ports.

3. The power monitoring system according to claim 2, wherein the detecting module is connected to each of the plurality of power supply port and the input module through a multitasking unit.

4. The power monitoring system according to claim 2, wherein the control module controls each the plurality of switches by a preset rule, and the preset rule comprises acts of:

reading the power consumption value from the detecting module and receiving the address to each of the plurality of switches which is corresponding to the power consumption value;

comparing the power consumption value with the preset threshold value;

when the power consumption value is higher than the preset threshold value, each of the corresponding switches are switched to a high power efficiency mode according to the addresses; and when the power consumption value is lower than the preset threshold value, each of the corresponding switches are switched to a low power consumption efficiency mode according to the addresses.

5. The power monitoring system according to claim 2, further comprising a wireless transmission module being electrically connected with the control module and being communicated with a remote server by a wireless network, wherein the remote server is communicated with the control module through the wireless transmission module by the wireless network to read each the power consumption value corresponded to the address of each of the plurality of switches, and instructs the control module to control the corresponding address of each of the plurality of switches.

6. The power monitoring system according to claim 5, wherein the wireless transmission module is in compliance with IEEE802.11 or IEEE 802.15.4 standard communication transmission module.

7. The multi-ports power monitoring system according to claim 1, wherein when the first switch is conducted and the second switch is not conducted, the plurality of switches is in a low power consumption efficiency mode;

when the first switch is not conducted and the second switch is conducted, the plurality of switches is in a high power efficiency mode; and when both the first switch and the second switch are not conducted, the plurality of switches is in a turned off mode.

8. The multi-ports power monitoring system according to claim 1, further comprising:

a first low resistance unit being electrically connected to the input module and the plurality of switches for lowering a impedance between the input module and each of the plurality of switches; and a second low resistance unit being electrically connected to the input module and each the plurality of power supply ports for lowering a impedance between the input module and each the plurality of power supply ports.

9. The multi-ports power monitoring system according to claim 8, wherein the first low resistance unit and the second low resistance unit respectively comprises:

a conducting line; and a conductor being overlapped on one surface of the conducting line, wherein the conducting line and the conductor are in parallel and are electrically connected to each other.

* * * * *